United States Patent
Yabu

(10) Patent No.: US 7,170,729 B2
(45) Date of Patent: Jan. 30, 2007

(54) SEMICONDUCTOR INTEGRATED CIRCUIT DEVICE

(75) Inventor: Hiroaki Yabu, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 85 days.

(21) Appl. No.: 11/081,669

(22) Filed: Mar. 17, 2005

(65) Prior Publication Data

US 2005/0254188 A1    Nov. 17, 2005

(30) Foreign Application Priority Data

May 14, 2004    (JP)    ............................. 2004-144690

(51) Int. Cl.
*H02H 9/00*    (2006.01)
(52) U.S. Cl. .................... 361/56; 361/111; 361/91.5
(58) Field of Classification Search ................. 361/56, 361/111, 91.5
See application file for complete search history.

(56) References Cited

U.S. PATENT DOCUMENTS 4,754,158 A * 6/1988 Halberstein ................. 327/377
5,978,192 A * 11/1999 Young et al. ................. 361/56
6,072,682 A * 6/2000 Ravanelli et al. ........... 361/111
6,614,633 B1 * 9/2003 Kohno ......................... 361/56

FOREIGN PATENT DOCUMENTS

JP    7-086906    3/1995
JP    07-086906    *    3/1995

OTHER PUBLICATIONS

Adel S. Sedra and Kenneth C. Smith, "Microelectronics Circuits", 1987, CBS College Publishing, Second Edition, pp. 342-410.*

* cited by examiner

*Primary Examiner*—Brian Sircus
*Assistant Examiner*—Terrence Willoughby
(74) *Attorney, Agent, or Firm*—McDermott Will & Emery LLP

(57) ABSTRACT

A semiconductor integrated circuit of the present invention includes, between a power line 1 and a ground line 2, an NMIS transistor 3 capable of supplying fixed signals with low and high levels to the outside, an NMIS transistor 6 having a source connected to a gate of the NMIS transistor 3, a PMIS transistor 7 having a drain connected to a gate of the NMIS transistor 6, and an ESD protection power clamp circuit 14. If a surge is applied to the power line 1, the ESD protection power clamp circuit 14 is clamped to pass the surge to the ground line. While the surge is passed, the potential of the power line 1 rises to turn on the three transistors 3, 6, and 7. At this time, the NMIS transistor 6 and the PMIS transistor 7 can reduce the gate potential of the NMIS transistor 3 lower than the potential of the power line 1.

2 Claims, 3 Drawing Sheets

SEMICONDUCTOR INTEGRATED CIRCUIT DEVICE

CROSS-REFERENCE TO RELATED APPLICATIONS

This application claims priority under 35 U.S.C. § 119 on patent application Ser. No. 2004-144690 filed in Japan on May 14, 2004, the entire contents of which are hereby incorporated by reference.

BACKGROUND OF THE INVENTION (a) Fields of the Invention

The present invention relates to semiconductor integrated circuit devices. In particular, the present invention relates to semiconductor integrated circuit devices which have a circuit for preventing electrostatic breakdown and which supply fixed signals with low and high levels to another circuit.

(b) Description of Related Art

In a recent field of fabrication process of semiconductor integrated circuit devices, technologies for miniaturization and high packing density of the devices have been developed, and thus high integration thereof has been proceeding. Accompanied with this trend, the semiconductor integrated circuit devices become sensitive to damages caused by electrostatic discharges. For example, the possibility is growing that a surge entering from an external connection terminal breaks elements of an input circuit, an output circuit, an input and output circuit, or an internal circuit and therefore performances of the elements are degraded. To prevent this, a protection circuit additionally attached to the external connection terminal and protecting from the surge the input circuit, the output circuit, the input and output circuit, or the internal circuit.

FIGS. 5 and 6 are diagrams showing conventional configurations of electric circuits for supplying fixed signals with low and high levels to another circuit. A semiconductor integrated circuit shown in FIG. 5 is provided with an NMIS (Metal-Insulator-Semiconductor) transistor 103 and a power clamp circuit for electrostatic discharge protection (referred hereinafter to as an ESD protection power clamp circuit) 104. In this configuration, a gate of the NMIS transistor 103 is directly connected to a power line 101. When the power line 101 is at a high level, the NMIS transistor 103 is turned on. In response to this, a low-level output line 105 becomes a low level and supplies a fixed low-level signal to another circuit.

A semiconductor integrated circuit shown in FIG. 6 is provided with a PMIS transistor 106 and an ESD protection power clamp circuit 104. In this configuration, a gate of the PMIS transistor 106 is directly connected to a ground line 102. When the ground line 102 is at a low level, the PMIS transistor 106 is turned on. In response to this, a high-level output line 105 becomes a high level and supplies a fixed high-level signal to another circuit. The ESD protection power clamp circuits 104 shown in FIGS. 5 and 6 are off during normal operations. However, for example, if a surge due to an electrostatic discharge is applied to the power line 101, the ESD protection power clamp circuit 104 is clamped to pass the surge to the ground line (see, for example, Japanese Unexamined Patent Publication No. H07-86906).

While the ESD protection power clamp circuit 104 passes the surge to the ground line 102, however, the potential of the power line 101 rises and a potential difference is generated between a substrate and the gate of the NMIS transistor 103 or the PMIS transistor 106. If this potential difference is above the breakdown voltage of the gate insulating film of the NMIS transistor 103 or the PMIS transistor 106, the gate insulating film is broken down. Once the gate insulating film is broken down, this circuit cannot supply a fixed signal to another circuit.

In addition, recently, accompanied with miniaturization of fabrication processes, a gate insulating film has been increasingly thinned. As a consequence of this, the breakdown voltage of the film has been lowering. Also by this trend, the gate insulating film has come to be broken down more easily.

In order to prevent generation of a potential between a gate and a substrate, an approach is conceivable in which the dimensions of a transistor of the ESD protection power clamp circuit are increased to enhance the performance of the circuit. However, with this approach, the area of the ESD protection power clamp circuit is increased to enlarge the chip size. Consequently, the formed device is against the demands of miniaturization.

SUMMARY OF THE INVENTION

An object of the present invention is to provide a semiconductor integrated circuit device which can supply fixed signals with low and high levels to the outside during normal operation and which can control a potential placed on a gate of a transistor for supplying the signals if a surge due to an electrostatic discharge or the like is applied to a power line.

A first semiconductor integrated circuit device of the present invention comprises: a power line; a ground line; a first insulated-gate element having a source connected to the ground line; a low-level output line connected to a drain of the first insulated-gate element to output a low level signal; a first gate potential control circuit connected to the power line and the ground line, having an output terminal connected to a gate of the first insulated-gate element, and capable of controlling the gate potential of the first insulated-gate element; and a power clamp circuit for electrostatic discharge (ESD) protection connected to the power line and the ground line.

With this device, if a surge is applied to the power line, the ESD protection power clamp circuit is clamped to pass the surge to the ground line. While the ESD protection power clamp circuit passes the surge, the potential of the power line rises. However, the first gate potential control circuit can reduce a potential placed on the gate of the first insulated-gate element to a low value, so that the potential difference between a substrate and the gate of the first insulated-gate element can be made lower than the potential difference between the power line and the ground line.

Moreover, the first gate potential control circuit delays application of voltage to the gate of the first insulated-gate element, which prevents a conventional high-voltage application to the gate of the first insulated-gate element before turning on of the ESD protection power clamp circuit. Because of the foregoing, gate insulating film breakdown can be prevented in the case where a surge is applied. Furthermore, during normal operation, the device can output a fixed low-level signal.

In the semiconductor integrated circuit device described above, the first insulated-gate element may be a first NMIS transistor, the first gate potential control circuit may include a first PMIS transistor and a second NMIS transistor, the first PMIS transistor may have a source connected to the power line and a gate connected to the low-level output line, and the second NMIS transistor may have a drain connected to the power line, a source connected to the gate of the first NMIS transistor, and a gate for receiving a signal from a drain of the first PMIS transistor.

In this case, if a surge is applied to the power line, the ESD protection power clamp circuit is clamped to pass the surge to the ground line. While the ESD protection power clamp circuit passes the surge, the potential of the power line rises to turn on the first PMIS transistor. In response to the turning on of the first PMIS transistor, the gate potential of the second NMIS transistor becomes a high level to turn on the second NMIS transistor. When the second NMIS transistor is turned on, the gate potential of the first NMIS transistor becomes lower than the potential of the power line.

On the other hands, in normal operation, when a power voltage is applied to the power line, the first PMIS transistor is turned on. In response to this, the gate potential of the second NMIS transistor becomes a high level to turn on the second NMIS transistor. At this time, even though the second NMIS transistor drops the gate potential (VDD−Vt), the dropped potential is higher than the threshold voltage Vt of the first NMIS transistor. Thus, the first NMIS transistor can maintain the on state. Therefore, the first NMIS transistor is still on and can always output a fixed low-level signal.

In the semiconductor integrated circuit device described above, the first gate potential control circuit may further include at least one third NMIS transistor provided between the drain of the first PMIS transistor and the gate of the second NMIS transistor, and the third NMIS transistor may have a drain connected to the power line, a gate for receiving a signal from the drain of the first PMIS transistor, and a source for supplying a signal to the gate of the second NMIS transistor.

In this case, the third NMIS transistor is provided to further drop the gate potential of the first NMIS transistor. Therefore, the potential difference between the substrate and the gate of the first NMIS transistor can be further reduced. Moreover, voltage application to the gate of the first NMIS transistor is further delayed, so that gate insulating film breakdown can be prevented more certainly.

A second semiconductor integrated circuit device of the present invention comprises: a power line; a ground line; a second insulated-gate element having a source connected to the power line; a high-level output line connected to a drain of the second insulated-gate element to output a high level signal; a second gate potential control circuit connected to the power line and the ground line, having an output terminal connected to a gate of the second insulated-gate element, and capable of controlling the gate potential of the second insulated-gate element; and a power clamp circuit for electrostatic discharge (ESD) protection connected to the power line and the ground line.

With this device, if a surge is applied to the power line, the ESD protection power clamp circuit is clamped to pass the surge to the ground line. While the ESD protection power clamp circuit passes the surge, the potential of the power line rises. However, by the second gate potential control circuit, the gate potential of the second insulated-gate element can be a floating value as compared with the potential of the ground line, so that the potential difference between the substrate and the gate of the second insulated-gate element can be made lower than the potential difference between the power line and the ground line.

Moreover, the second gate potential control circuit delays application of voltage to the gate of the second insulated-gate element, which prevents a conventional high-voltage application to the gate of the second insulated-gate element before turning on of the ESD protection power clamp circuit. Because of the foregoing, gate insulating film breakdown can be prevented in the case where a surge is applied. Furthermore, during normal operation, the device can output a fixed high-level signal.

In the semiconductor integrated circuit device described above, the second insulated-gate element is a second PMIS transistor, the second gate potential control circuit includes a fourth NMIS transistor and a third PMIS transistor, the fourth NMIS transistor has a source connected to the ground line and a gate connected to the high-level output line, and the third PMIS transistor has a drain connected to the ground line, a source connected to the gate of the second PMIS transistor, and a gate for receiving a signal from a drain of the fourth NMIS transistor.

In this case, if a surge is applied to the power line, the ESD protection power clamp circuit is clamped to pass the surge to the ground line. While the ESD protection power clamp circuit passes the surge, the potential of the power line rises to turn on the second PMIS transistor. In response to the turning on of the second PMIS transistor, the high-level output line becomes a high level to turn on the fourth NMIS transistor. By turning on the fourth NMIS transistor, the gate potential of the third PMIS transistor becomes a low level to turn on the third PMIS transistor. When the third PMIS transistor is turned on, the gate potential of the second PMIS transistor becomes a floating potential as compared with the potential of the ground line.

On the other hands, in normal operation, when a power voltage is applied to the power line, the second PMIS transistor is turned on. In response to this, the high-level output line becomes a high level to turn on the fourth NMIS transistor. The gate potential of the third PMIS transistor becomes a low level to turn on the second PMIS transistor. At this time, even though the third PMIS transistor raises the gate potential (VSS+Vt), the raised potential is lower than the on voltage of the second PMIS transistor (VDD−Vt). Thus, the second PMIS transistor can maintain the on state. Therefore, the second PMIS transistor is still on and can always output a fixed high-level signal.

In the semiconductor integrated circuit device described above, the second gate potential control circuit may further include at least one fourth PMIS transistor provided between the drain of the fourth NMIS transistor and the gate of the third PMIS transistor, and the fourth PMIS transistor may have a drain connected to the ground line, a gate for receiving a signal from the drain of the fourth NMIS transistor, and a source for supplying a signal to the gate of the third PMIS transistor.

In this case, the fourth PMIS transistor is provided to further raise the gate potential of the second PMIS transistor. Therefore, the potential difference between the substrate and the gate of the second PMIS transistor can be further reduced. Moreover, voltage application to the gate of the second PMIS transistor is further delayed, so that gate insulating film breakdown can be prevented more certainly.

DETAILED DESCRIPTION OF THE PREFERRED EMBODIMENTS (First Embodiment)

Figure 1:
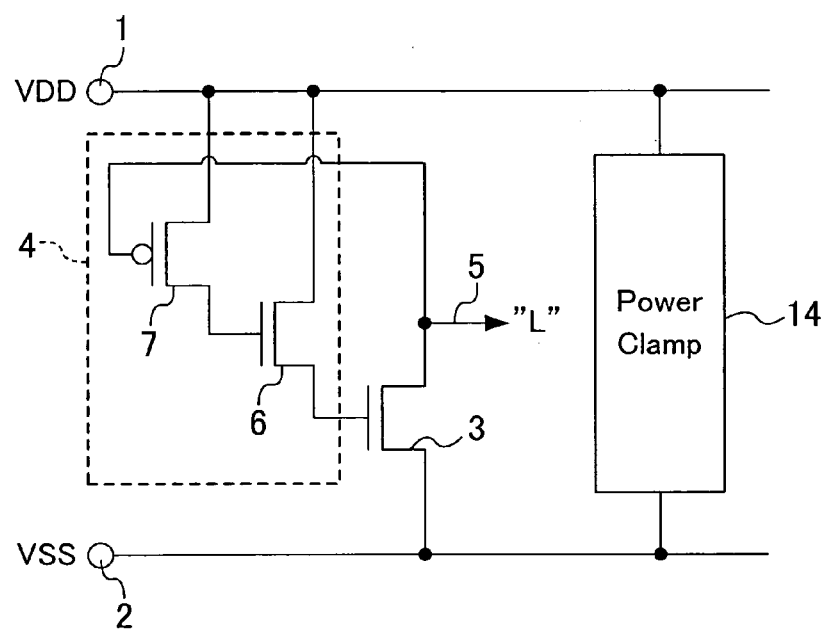
FIG. 1 is a circuit diagram showing the configuration of a semiconductor integrated circuit device of a first embodiment having a gate potential control circuit and supplying a fixed low-level signal.

Hereinafter, a first embodiment of the present invention will be described with reference to the accompanying drawings. FIG. 1 is a circuit diagram showing the configuration of a semiconductor integrated circuit device of the first embodiment having a gate potential control circuit and supplying a fixed low-level signal.

Referring to FIG. 1, the semiconductor integrated circuit device of the first embodiment includes an NMIS transistor 3, a gate potential control circuit 4, and a power clamp circuit 14 for electrostatic discharge protection (referred hereinafter to as an ESD protection power clamp circuit 14) which are provided between a power line 1 and a ground line 2. The NMIS transistor 3 has a source connected to the ground line 2, a drain connected to a low-level output line 5 for outputting a fixed low-level signal, and a gate connected to an output terminal of the gate potential control circuit 4.

The gate potential control circuit 4 includes an NMIS transistor 6 and a PMIS transistor 7. The PMIS transistor 7 has a source connected to the power line 1 for supplying a power voltage, a drain connected to a gate of the NMIS transistor 6, and a gate connected to the low-level output line 5. The NMIS transistor 6 has a drain connected to the power line 1, a source connected to the gate of the NMIS transistor 3, and the gate connected to the drain of the PMIS transistor 7.

Next description will be made of operations of the semiconductor integrated circuit device of the first embodiment in surge application and in normal operation.

First, when a surge is applied to the power line 1, the ESD protection power clamp circuit 14 is clamped to pass the surge to the ground line 2. While the ESD protection power clamp circuit 14 passes the surge, the potential of the power line 1 rises. In response to this, the PMIS transistor 7 is turned on and the gate potential of the NMIS transistor 6 connected to the PMIS transistor 7 becomes a high level to turn on the NMIS transistor 6. When the NMIS transistor 6 is turned on, the corresponding voltage drop reduces the gate potential of the NMIS transistor 3 lower than the potential of the power line 1. Therefore, the potential difference between the substrate and the gate of the NMIS transistor 3 can be made lower than the potential difference between the power line and the ground line, which prevents breakdown of the gate insulating film of the NMIS transistor 3. In this operation, even though the NMIS transistor 6 drops the gate potential (VDD−Vt), the dropped potential is higher than the threshold voltage Vt of the NMIS transistor 3. Thus, the NMIS transistor 3 can maintain the on state. Therefore, even though the potential drop occurs, the NMIS transistor 3 is still on and the low-level output line 5 outputs a low level signal.

On the other hands, in normal operation, when a power voltage is applied to the power line 1, the PMIS transistor 7 is turned on. In response to this, the gate potential of the NMIS transistor 6 becomes a high level to turn on the NMIS transistor 6. By turning on the NMIS transistor 6, the corresponding voltage drop makes the gate potential of the NMIS transistor 3 lower than the potential of the power line 1. However, even though the NMIS transistor 6 drops the gate potential (VDD−Vt), the dropped potential is higher than the threshold voltage Vt of the NMIS transistor 3. Thus, the NMIS transistor 3 can maintain the on state. Therefore, even though the potential drop occurs, the NMIS transistor 3 is still on and the low-level output line 5 outputs a low level signal. By the low level signal output from the low-level output line 5, the PMIS transistor 7 maintains the on state and the low-level output line 5 always outputs a low level signal.

As described above, in the first embodiment, in the case where a surge is applied to the power line, the potential difference generated between the substrate and the gate of the NMIS transistor 3 for outputting a low level signal can be reduced lower than the potential difference between the power line and the ground line. Therefore, gate insulating film breakdown can be prevented.

Moreover, the PMIS transistor 7 delays application of voltage to the gate of the NMIS transistor 3, which prevents a conventional high-voltage application to the gate of the NMIS transistor 3 before turning on of the ESD protection power clamp circuit 14. Also by this, gate insulating film breakdown can be prevented.

Furthermore, by delaying an output signal from the NMIS transistor 3, high-potential application to another circuit connected to the output line can also be prevented.

Figure 2:
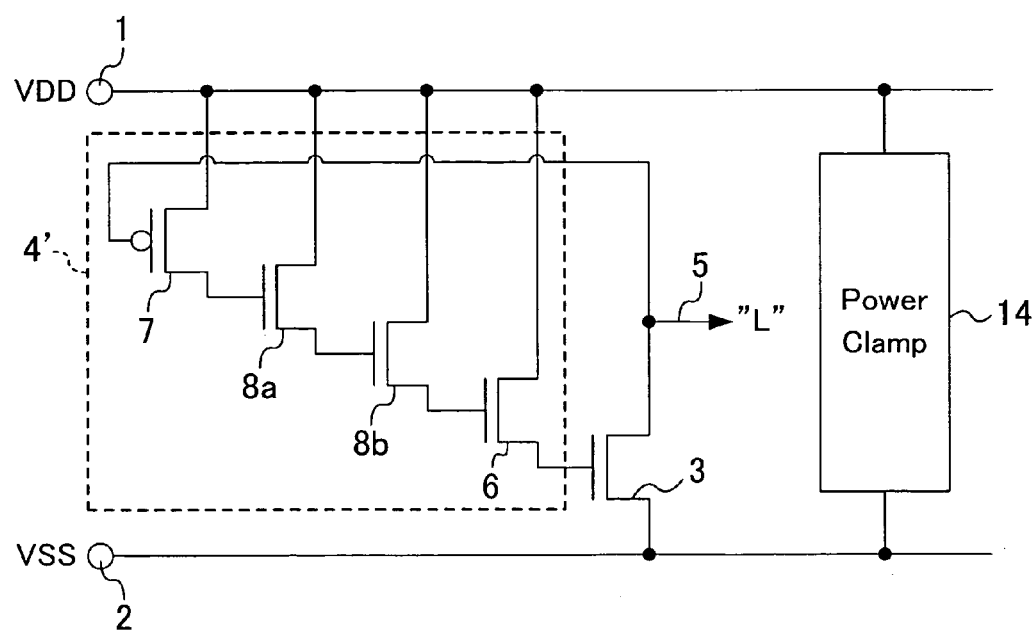
FIG. 2 is a circuit diagram according to a modification of the first embodiment.

The above description has been made of the case where one NMIS transistor is provided in the gate potential control circuit 4. Alternatively, as shown in FIG. 2, a plurality of NMIS transistors may be provided therein. FIG. 2 is a circuit diagram according to a modification of the first embodiment.

FIG. 2 differs from FIG. 1 in that the gate potential control circuit 4' has NMIS transistors 8a and 8b provided between the drain of the PMIS transistor 7 and the gate of the NMIS transistor 6. To be more specific, a gate of the NMIS transistor 8a is connected to the drain of the PMIS transistor 7, a drain thereof is connected to the power line 1, and a source thereof is connected to a gate of the NMIS transistor 8b. A source of the NMIS transistor 8b is connected to the gate of the NMIS transistor 6, and a drain thereof is connected to the power line 1. In FIG. 2, two transistors, that is, the NMIS transistors 8a and 8b are additionally provided in the gate potential control circuit 4', but one transistor or three or more transistors may be additionally provided therein.

With this circuit configuration, when the PMIS transistor 7 is turned on, the NMIS transistors 8a, 8b, and 6 are sequentially turned on. Therefore, the gate potential of the NMIS transistor 3 can be dropped lower than the potential of the power line 1 by the extent corresponding to these transistors, and high-voltage application to the gate of the NMIS transistor 3 can be delayed. This prevents breakdown of the gate insulating film of the NMIS transistor 3.

(Second Embodiment)

Figure 3:
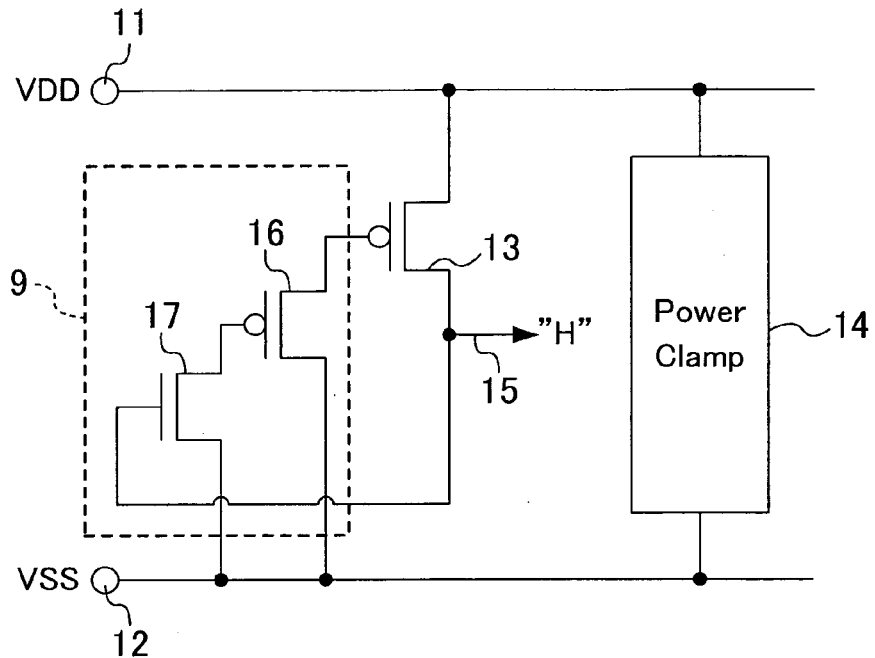
FIG. 3 is a circuit diagram showing the configuration of a semiconductor integrated circuit device of a second embodiment having a gate potential control circuit and supplying a fixed high-level signal.

A second embodiment of the present invention will be described below with reference to the accompanying drawings. FIG. 3 is a circuit diagram showing the configuration of a semiconductor integrated circuit device of the second embodiment having a gate potential control circuit and supplying a fixed high-level signal.

Referring to FIG. 3, the semiconductor integrated circuit device of the second embodiment includes a PMIS transistor 13, a gate potential control circuit 9, and an ESD protection power clamp circuit 14 which are provided between a power line 11 and a ground line 12. The PMIS transistor 13 has a source connected to the power line 11 for supplying a power voltage, a drain connected to a high-level output line 15 for outputting a fixed high-level signal, and a gate connected to an output terminal of the gate potential control circuit 9.

The gate potential control circuit 9 includes a PMIS transistor 16 and an NMIS transistor 17. The NMIS transistor 17 has a source connected to the ground line 12, a drain connected to a gate of the PMIS transistor 16, and a gate connected to the high-level output line 15. The PMIS transistor 16 has a drain connected to the ground line 12, a source connected to the gate of the PMIS transistor 13, and the gate connected to the drain of the NMIS transistor 17.

Next description will be made of operations of the semiconductor integrated circuit device mentioned above in surge application and in normal operation.

First, when a surge is applied to the power line 11, the ESD protection power clamp circuit 14 is clamped to pass the surge to the ground line 12. While the ESD protection power clamp circuit 14 passes the surge, the potential of the power line 11 rises. In response to this, the PMIS transistor 13 is turned on. When the PMIS transistor 13 is turned on, the high-level output line 15 becomes a high level to supply a high level voltage to the gate of the NMIS transistor 17 connected to the drain of the PMIS transistor 13. In response to this, the NMIS transistor 17 is turned on and the gate potential of the PMIS transistor 16 becomes a low level to turn on the PMIS transistor 16. When the PMIS transistor 16 is turned on, the gate potential of the PMIS transistor 13 becomes a floating potential as compared with the potential of the ground line 12. This makes the potential difference between the substrate and the gate of the PMIS transistor 13 lower than the potential difference between the power line and the ground line and prevents gate insulating film breakdown of the PMIS transistor 13. In this operation, even though the PMIS transistor 16 raises the gate potential (VSS+Vt), the raised potential is lower than the on voltage of the PMIS transistor 13 (VDD−Vt). Thus, the PMIS transistor 13 can maintain the on state. Therefore, even though the potential rise occurs, the PMIS transistor 13 is still on and the high-level output line 15 keeps a high level.

On the other hands, in normal operation, when a power voltage is applied to the power line 11, the PMIS transistor 13 is turned on and supplies a high level signal to the high-level output line 15. When the high-level output line 15 becomes a high level, the NMIS transistor 17 having the gate connected to the high-level output line is turned on. In response to this, the gate potential of the PMIS transistor 16 becomes a low level to turn on the PMIS transistor 16. At this time, by turning on the PMIS transistor 16 and the NMIS transistor 17, the gate potential of the PMIS transistor 13 varies from the potential level of the ground line to a floating potential. However, even though the PMIS transistor 16 raises the gate potential (VSS+Vt), the raised potential is lower than the on voltage of the PMIS transistor 13 (VDD−Vt). Thus, the PMIS transistor 13 can maintain the on state. Therefore, even though the potential rise occurs, the PMIS transistor 13 is still on and the high-level output line 15 keeps a high level.

As described above, in the second embodiment, in the case where a surge is applied to the power line, the potential difference generated between the substrate and the gate of the PMIS transistor 13 for outputting a high level signal can be reduced lower than the potential difference between the power line and the ground line. Therefore, gate insulating film breakdown can be prevented.

Moreover, the NMIS transistor 17 delays application of voltage to the gate of the PMIS transistor 13, which prevents a conventional high-voltage application to the gate of the PMIS transistor 13 before turning on of the ESD protection power clamp circuit 14. Also by this, gate insulating film breakdown can be prevented.

Furthermore, by delaying an output signal from the PMIS transistor 13, high-potential application to another circuit connected to the output line can also be prevented.

Figure 4:
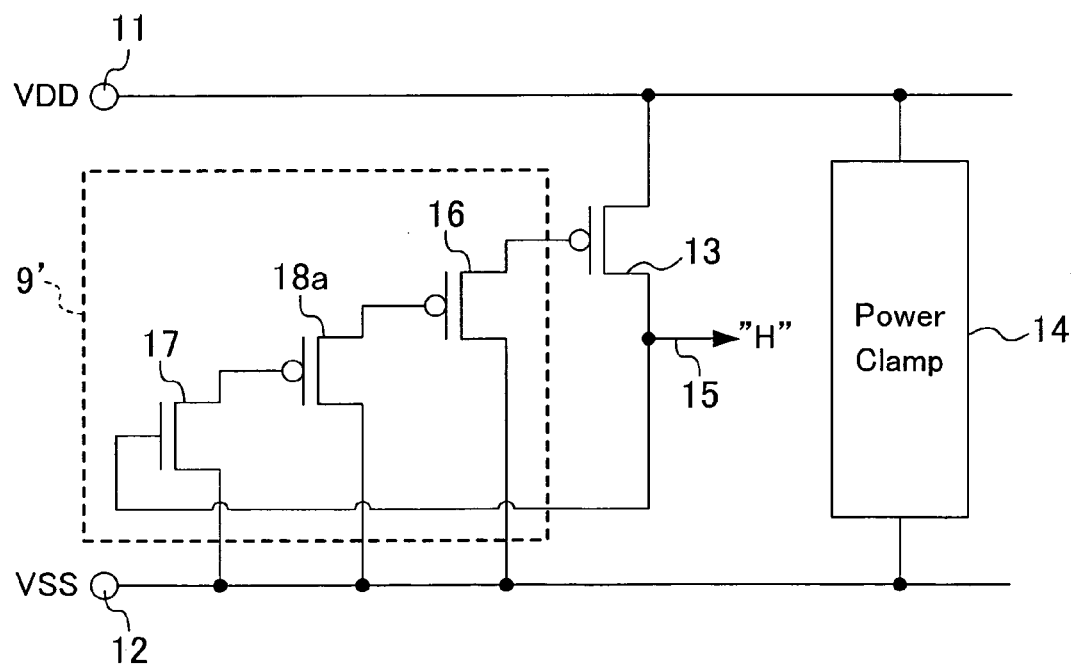
FIG. 4 is a circuit diagram according to a modification of the second embodiment.
Figure 5:
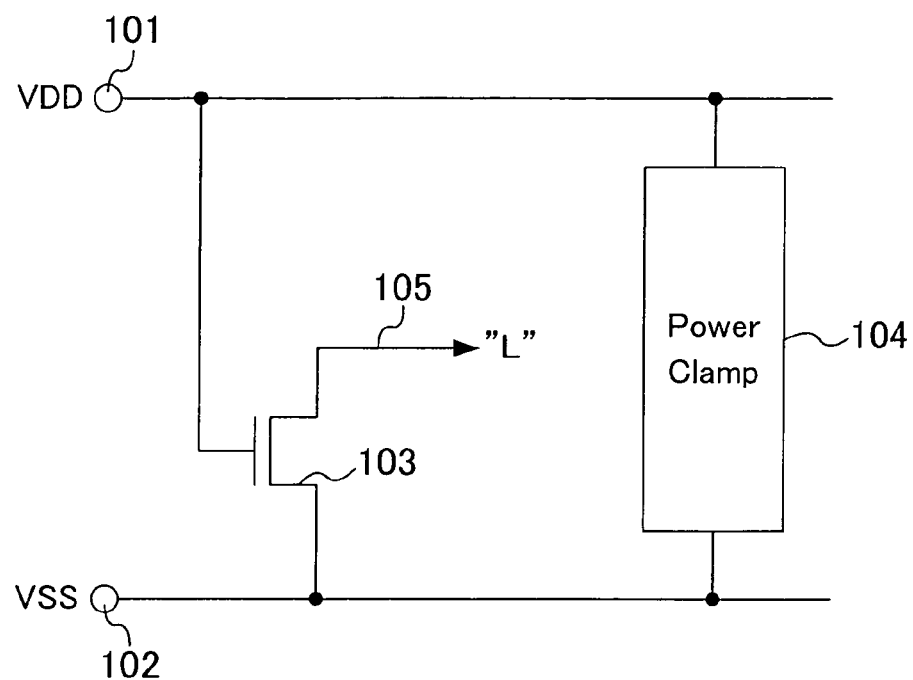
FIG. 5 is a circuit diagram showing a conventional configuration of an electric circuit for supplying a fixed low-level signal to another circuit.
Figure 6:
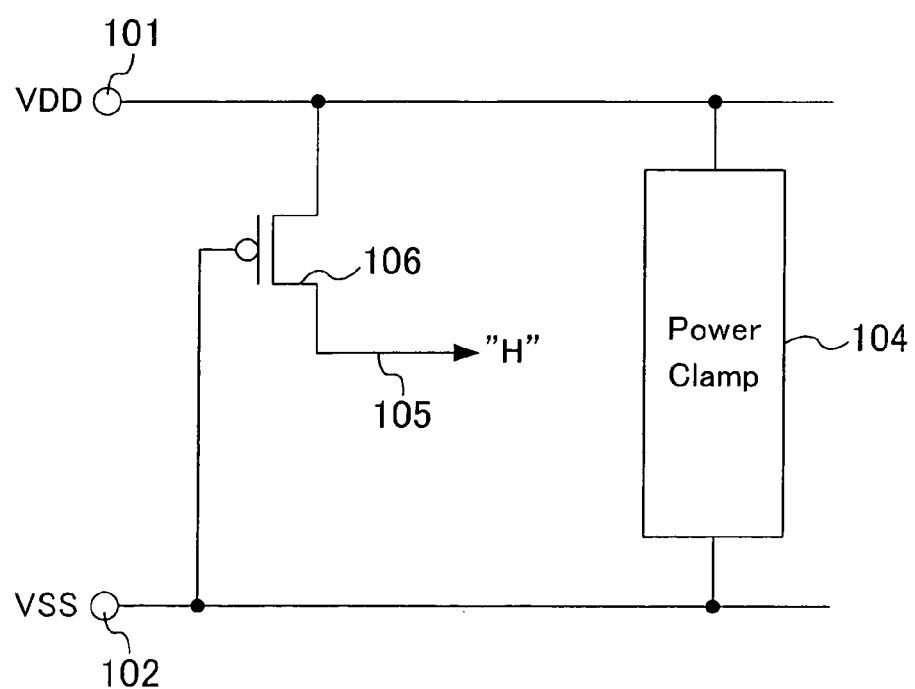
FIG. 6 is a circuit diagram showing a conventional configuration of an electric circuit for supplying a fixed high-level signal to another circuit.

The above description has been made of the case where one PMIS transistor is provided in the gate potential control circuit 4. Alternatively, as shown in FIG. 4, a plurality of PMIS transistors may be provided therein. FIG. 4 is a circuit diagram according to a modification of the second embodiment.

FIG. 4 differs from FIG. 3 in that the gate potential control circuit 9' has a PMIS transistor 18a provided between the NMIS transistor 17 and the PMIS transistor 16. To be more specific, a gate of the PMIS transistor 18a is connected to the drain of the NMIS transistor 17, a source thereof is connected to the gate of the PMIS transistor 16, and a drain thereof is connected to the ground line 12. In FIG. 4, one transistor, that is, the PMIS transistor 18a is additionally provided in the gate potential control circuit 9', but multiple transistors may be additionally provided therein.

With this circuit configuration, when the NMIS transistor 17 is turned on, the PMIS transistors 18a and 16 are sequentially turned on. Therefore, the gate potential of the PMIS transistor 13 can be raised higher than the potential of the ground line 12 by the extent corresponding to these transistors, and high-voltage application to the gate of the PMIS transistor 13 can be prevented. This prevents breakdown of the gate insulating film of the PMIS transistor 13.

What is claimed is:

1. A semiconductor integrated circuit device comprising:
   a power line;
   a ground line;
   a first PMIS transistor having a source connected to the power line;
   a high-level output line connected to a drain of the first PMIS transistor to output a high level signal;
   a gate potential control circuit having a NMIS transistor and a second PMIS transistor; and
   a power clamp circuit for electrostatic discharge protection connected to the power line and the ground line;
   wherein the NMIS transistor has a source connected to the ground line and a gate connected to the high-level output line, and
   the second PMIS transistor has a drain connected to the ground line, a source connected to the gate of the first PMIS transistor, and a gate for receiving a signal from a drain of the NMIS transistor.

2. The device of claim 1,
   wherein the gate potential control circuit further includes at least one third PMIS transistor provided between the drain of the NMIS transistor and the gate of the second PMIS transistor, and
   the third PMIS transistor has a drain connected to the ground line, a gate for receiving a signal from the drain of the NMIS transistor, and a source for supplying a signal to the gate of the second PMIS transistor.

* * * * *